(12) United States Patent
Li et al.

(10) Patent No.: US 7,855,154 B2
(45) Date of Patent: Dec. 21, 2010

(54) METHODS OF FORMING INTERMEDIATE SEMICONDUCTOR DEVICE STRUCTURES USING SPIN-ON, PHOTOPATTERNABLE, INTERLAYER DIELECTRIC MATERIALS

(75) Inventors: Weimin Li, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 749 days.

(21) Appl. No.: 11/391,774

(22) Filed: Mar. 29, 2006

(65) Prior Publication Data

US 2006/0172079 A1 Aug. 3, 2006

Related U.S. Application Data

(62) Division of application No. 10/435,791, filed on May 12, 2003, now Pat. No. 7,060,637.

(51) Int. Cl.
*H01L 21/316* (2006.01)

(52) U.S. Cl. .............. 438/787; 438/788; 438/789; 438/790; 427/510; 427/520; 430/270.1; 430/275.1; 430/315

(58) Field of Classification Search .......... None
See application file for complete search history.

(56) References Cited

U.S. PATENT DOCUMENTS

| | | | |
|---|---|---|---|
| 4,770,739 A | 9/1988 | Orvek et al. | |
| 5,024,919 A | 6/1991 | Yamauchi | |
| 5,407,782 A | 4/1995 | Kobayashi | |
| 5,716,882 A | 2/1998 | Tseng | |
| 5,905,130 A | 5/1999 | Nakahara et al. | |
| 5,989,983 A | 11/1999 | Goo et al. | |
| 6,232,235 B1 | 5/2001 | Cave et al. | |
| 6,350,706 B1 | 2/2002 | Howard | |
| 6,420,084 B1 * | 7/2002 | Angelopoulos et al. | .. 430/270.1 |
| 6,426,127 B1 | 7/2002 | Ross et al. | |
| 6,479,405 B2 | 11/2002 | Lee et al. | |
| 6,706,646 B1 | 3/2004 | Lee et al. | |
| 6,803,660 B1 | 10/2004 | Gates et al. | |
| 6,902,875 B2 * | 6/2005 | Nagahara et al. | ............ 430/325 |
| 2001/0012592 A1 * | 8/2001 | Joubert et al. | ................. 430/5 |
| 2002/0039809 A1 * | 4/2002 | Howard | ..................... 438/118 |
| 2002/0055271 A1 | 5/2002 | Lee et al. | |

FOREIGN PATENT DOCUMENTS

| | | |
|---|---|---|
| EP | 1 239 332 A1 | 9/2002 |
| JP | 59-149025 A | 8/1984 |
| JP | 63-14432 A | 1/1988 |
| JP | 5-88373 A * | 4/1993 |
| JP | 7-321339 * | 12/1995 |
| JP | 09-232428 | 9/1997 |
| JP | 2000-031118 | 1/2000 |
| JP | 2000-114260 | 4/2000 |
| JP | 2000-181069 | 6/2000 |
| WO | WO 03/044078 A1 | 5/2003 |

OTHER PUBLICATIONS

"Conversion of Some Siloxane Polymers to Silicon Oxide by UV/Ozone Photochemical Processes" authored by Ouyang et al. and published in Chem Mat. 2000, 12(6), 1591-1596.*
abstract for JP 7-321339.*
International Search Report dated Jul. 15, 2005 (4 pages).
Patent Abstract of Japan, 60245138, Dec. 1985, (1 page).
Lin, "Portable Intimately Contacted Mask," IBM Technical Disclosure Bulletin, vol. 21, No. 5, Oct. 1978 (1 page).
Taiwan Patent Application No. 093112737 Search Report dated Feb. 8, 2008.

* cited by examiner

*Primary Examiner*—Marc S Zimmer
(74) *Attorney, Agent, or Firm*—TraskBritt

(57) ABSTRACT

A cap layer that enables a photopatternable, spin-on material to be used in the formation of semiconductor device structures at wavelengths that were previously unusable. The photopatternable, spin-on material is applied as a layer to a semiconductor substrate. The cap layer and a photoresist layer are each formed over the photopatternable layer. The cap layer absorbs or reflects radiation and protects the photopatternable layer from a first wavelength of radiation used in patterning the photoresist layer. The photopatternable, spin-on material is convertible to a silicon dioxide-based material upon exposure to a second wavelength of radiation.

21 Claims, 2 Drawing Sheets

METHODS OF FORMING INTERMEDIATE SEMICONDUCTOR DEVICE STRUCTURES USING SPIN-ON, PHOTOPATTERNABLE, INTERLAYER DIELECTRIC MATERIALS

CROSS-REFERENCE TO RELATED APPLICATION

This application is a divisional of application Ser. No. 10/435,791, filed May 12, 2003, now U.S. Pat. No. 7,060,637, issued Jun. 13, 2006.

BACKGROUND OF THE INVENTION

1. Field of the Invention

The present invention relates to semiconductor processing technology and, more specifically, to using spin-on, photopatternable, interlayer dielectric materials at additional wavelengths of radiation.

2. State of the Art

Photoresist layers are used for making miniaturized electronic components when fabricating semiconductor devices, such as computer chips and integrated circuits. During fabrication, a thin photoresist layer is typically applied to a semiconductor substrate. The photoresist layer is then baked to evaporate solvent in the photoresist and to fix the photoresist onto the semiconductor substrate. To form a pattern on the photoresist layer, portions of the layer are exposed to radiation, such as visible light, ultraviolet ("UV") light, electron beam ("EB"), or X-ray radiant energy, through a mask. The radiation causes a photochemical reaction in portions of the photoresist layer that are exposed to the radiation, which changes the solubility of these portions. The solubility of unexposed portions of the photoresist layer is unchanged. The semiconductor substrate is treated with a developer solution that is selected to solubilize and remove the radiation-exposed portions of the photoresist layer. Since the exposed portions of the photoresist layer are removed, a desired pattern is formed in the photoresist layer. The pattern is transferred to underlying layers of the semiconductor device by conventional techniques, such as by wet or dry etching processes. The remaining portions of the photoresist layer are removed once the pattern is transferred to the underlying layers of the semiconductor device.

As memory requirements for the semiconductor devices have increased, the size of the electronic components in the semiconductor devices has decreased. To accomplish the decreased size, new photoresist materials sensitive to short wavelengths of radiation have been developed because the short wavelengths provide better resolution of features on the semiconductor devices. As used herein, the term "short wavelength" refers to a wavelength of approximately 100 nm to approximately 300 nm. Photoresist materials sensitive to this wavelength range are typically used when subhalfmicron geometries are required. For instance, photoresist materials sensitive to 248 nm are currently being used while photoresist materials sensitive to 193 nm are under development.

Spin-on, photopatternable, interlayer dielectric ("ILD") materials are known in the art and are available from sources, such as Clariant International, Ltd. (Muttenz, Switzerland). These ILD materials are photoresist materials that are convertible to a silica-type ceramic film when exposed to radiation. As disclosed in EP 1239332 to Nagahara et al., a photoresist composition that includes a polysilazane ("PSZ") compound and a photoacid generator ("PAG") is applied to a semiconductor wafer to form a photoresist layer. The photoresist layer is exposed to UV radiation, such as radiation of 360-430 nm, or EB radiation through a mask. In the exposed, or unmasked, portions of the photoresist layer, the radiation initiates the photochemical reaction and produces protons from the PAG. The protons are generated from an acid, which is produced by the photochemical reaction. No reaction occurs in the unexposed, or masked, portions of the photoresist layer and, therefore, no protons are produced in these portions of the photoresist layer. The protons react with oxygen ("$O_2$") and/or water ("$H_2O$") in the atmosphere to cleave Si—N bonds that are present in the PSZ. Subsequently, $H_2O$ reacts with the cleaved PSZ to form a methyl silsesquioxane ("MSQ"), which contains Si—O bonds. Since the protons are only formed in the exposed portions of the photoresist layer, selected portions of the photoresist layer are converted to the silica-type ceramic film. The silica-type ceramic film is selectively removed using tetramethylammonium hydroxide ("TMAH"), leaving the unexposed portions of the photoresist layer to create the desired pattern on the semiconductor substrate. These remaining portions are subsequently exposed to radiation of 360-430 nm to convert the photoresist layer into the silica-type ceramic film. The silica-type ceramic film has a low dielectric constant, has good insulating properties, is resistant to heat, abrasion, and corrosion, and is used in semiconductor devices, liquid crystal displays, and printed circuit substrates to form ILDs.

Additional photoresist materials that are convertible to an insulative material by exposure to radiation are disclosed in U.S. Pat. No. 6,350,706 to Howard. A plasma polymerized methylsilane is selectively converted to photo-oxidized siloxane, an insulative material, by exposure to deep ultraviolet ("DUV") radiation. Semiconductor device structures are formed by converting exposed portions of the photoresist material to the insulative material. By converting the photoresist material into the insulative material, a permanent structure is formed and the photoresist material does not have to be removed by an etch process.

One disadvantage of these photoresist materials is that they are sensitive to a single wavelength or narrow range of wavelengths. In other words, the conversion of the PSZ to the silica-type ceramic film occurs most efficiently at that wavelength(s), which typically ranges from 360 to 430 nm. At these wavelengths, a high degree of resolution is not possible, such as the resolution achieved by the 193 nm or 243 nm photoresists currently being developed and used. However, these latter wavelengths (193 nm or 243 nm) do not efficiently convert the PSZ to the silica-type ceramic film. Therefore, the application of these photoresist or ILD materials for front-end applications, where a short wavelength is essential to achieve the desired resolution, is severely limited. In addition, it is not possible to optimize both the patterning process and the conversion process and, as such, a user must compromise, or choose between, achieving each of these processes.

It would be desirable to be able to use the ILD materials at additional wavelengths, especially short wavelengths, so that the ILD materials are useful in a broader range of applications. It would also be desirable to be able to perform both the patterning process and the conversion process at conditions optimal for each process without having to compromise between achieving optimal patterning and optimal conversion.

BRIEF SUMMARY OF THE INVENTION

The present invention comprises a method of forming an intermediate semiconductor device structure. The method comprises providing a semiconductor substrate and forming a photopatternable layer over the semiconductor substrate. The photopatternable layer may comprise an organosilicon photoresist material that is formulated to be selectively converted to a silicon dioxide-based material, such as a silsesquioxane material, upon exposure to radiation. A cap layer and a photoresist layer may be formed over the photopatternable layer. The cap layer may comprise a material that absorbs or reflects radiation, such as a dielectric antireflective coating ("DARC"), a bottom antireflective coating ("BARC"), or a metal coating. The cap layer may comprise amorphous or diamond-like carbon. When the photoresist layer is exposed to a first wavelength of radiation, which may be used to produce a high resolution pattern in the photoresist layer, the cap layer protects the photopatternable layer from the first wavelength. However, the high resolution pattern may be subsequently transferred into the photopatternable layer by photolithography and etching techniques. Exposed portions of the photopatternable layer may be selectively converted to a silicon dioxide-based material by exposure to a second wavelength of radiation.

The present invention also encompasses an intermediate semiconductor device structure. The intermediate semiconductor device structure may comprise a semiconductor substrate and a photopatternable layer formed over the semiconductor substrate. The photopatternable layer may comprise an organosilicon photoresist material that is formulated to be selectively converted to a silicon dioxide-based material upon exposure to radiation. A cap layer formed from a material that absorbs or reflects radiation may be formed over at least a portion of the photopatternable layer. A photoresist layer may be formed over at least a portion of the cap layer. The photoresist layer may be sensitive to a wavelength ranging from approximately 100 nm to approximately 500 nm, which may be used to produce a high resolution pattern in the photoresist layer and the cap layer. The cap layer protects the photopatternable layer from exposure to this radiation. The high resolution pattern may be subsequently transferred into the photopatternable layer by photolithography and etching techniques. Exposed portions of the photopatternable layer may be selectively converted to a silicon dioxide-based material by exposure to a different wavelength of radiation.

BRIEF DESCRIPTION OF THE SEVERAL VIEWS OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

FIGS. 1A-1G show a process sequence of semiconductor device structures in accordance with the present invention.

DETAILED DESCRIPTION OF THE INVENTION

Figure 1G:
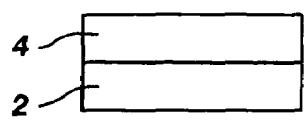
Figure 1G:
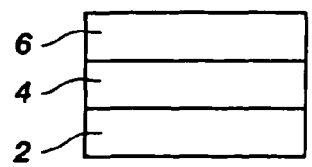
Figure 1G:
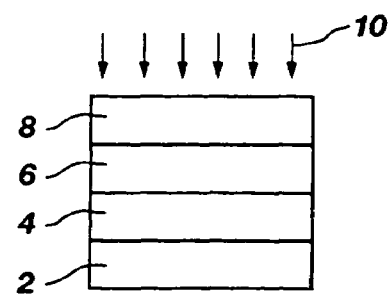
Figure 1G:
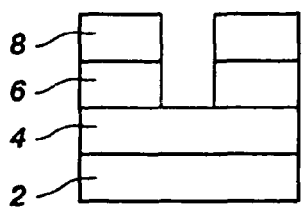
Figure 1G:
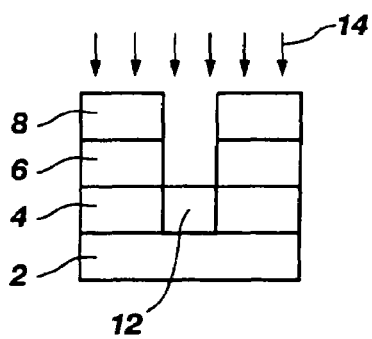
Figure 1G:
Figure 1G:
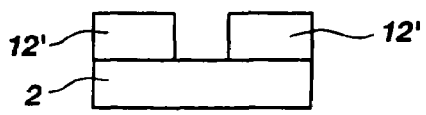

A photopatternable, spin-on material that is usable at additional wavelengths of radiation is disclosed. The photopatternable, spin-on material is applied to a semiconductor substrate as a layer and is covered by a cap layer that absorbs or reflects radiation. The cap layer protects the photopatternable layer from the radiation by blocking radiation from passing into the photopatternable layer.

The methods and structures described herein do not form a complete process flow for manufacturing semiconductor devices. The remainder of the process flow is known to those of ordinary skill in the art. Accordingly, only the process steps and structures necessary to understand the present invention are described.

As shown in FIG. 1A, a photopatternable layer 4 may be formed over a semiconductor substrate 2, which includes a semiconductor wafer or other substrate comprising a layer of semiconductor material. As used herein, the term "semiconductor substrate" includes silicon wafers, silicon on insulator ("SOI") substrates, silicon on sapphire ("SOS") substrates, epitaxial layers of silicon on a base semiconductor foundation and other semiconductor materials such as silicon-germanium, germanium, gallium arsenide and indium phosphide.

The photopatternable layer 4 may be formed from a material that is formulated to be selectively converted to a silicon dioxide ("$SiO_2$")-based material by exposure to radiation. The $SiO_2$-based material may include $SiO_2$ and derivatives thereof, such as alkylated or otherwise modified derivatives. The material of the photopatternable layer 4 may include an organosilicon photoresist material, such as a silicon polymer, a polysilyne, or a PSZ compound, and may be selected by one of ordinary skill in the art depending on the desired properties of the photopatternable layer 4. As used herein, the term "polysilazane" or PSZ refers to an oligomer, cyclic, polycyclic, linear polymer or resinous polymer having multiple Si—N repeating units. In one embodiment, the organosilicon photoresist material is a conventional PSZ compound. The photopatternable layer 4 may include a single organosilicon photoresist material or a mixture of organosilicon photoresist materials. For instance, if a PSZ compound is used, the PSZ compound may be a single PSZ compound, a mixture of multiple types of PSZ compounds, or a PSZ copolymer. The PSZ may have a linear, cyclic, or cross-linked structure. PSZ compounds are known in the art and may be synthesized by any known techniques, such as those disclosed in U.S. Pat. No. 5,905,130 to Nakahara et al.

The $SiO_2$-based material into which the material of the photopatternable layer 4 may be selectively converted is a silsesquioxane material ("SSQ"), which has Si—O bonds. SSQ materials are known in the art and include, but are not limited to, hydrogen silsesquioxane ("HSQ"), methyl silsesquioxane ("MSQ"), polyhydrogen silsesquioxane ("pHSQ"), hydrio polysilsesquioxane ("H—PSSQ"), methyl polysilsesquioxane ("M-PSSQ"), and phenyl polysilsesquioxane ("P—PSSQ"). In one embodiment, the $SiO_2$-based material is MSQ.

The photopatternable layer 4 may include a PAG to initiate the photochemical reaction that selectively converts the organosilicon photoresist material of the photopatternable layer 4 into the $SiO_2$-based material. The PAG may be a triazine, an oxazole, an oxadiazole, a thiazole, a substituted 2-pyrone, a sulfone compound, a sulfonate compound, or an-onium salt compound, such as a diazonium salt, an iodonium salt, or a sulfonium salt, halide, or ester. In one embodiment, the photopatternable layer 4 includes the PSZ compound and the PAG.

The photopatternable layer 4 may be formed on the semiconductor substrate 2 by a conventional coating technique including, but not limited to, dip coating, bar coating, spin coating, roll coating, spray coating, and flow coating. The coating technique used to deposit the photopatternable layer 4 may depend on the material used in the photopatternable layer 4. In one embodiment, the photopatternable layer 4 is spin-coated onto the semiconductor substrate 2. The photopatternable layer 4 may be formed to a thickness of approximately 0.05 μm to 4 μm.

A cap layer 6 may be formed over the photopatternable layer 4, as shown in FIG. 1B. The cap layer 6 prevents activation of the PAG by blocking radiation from passing into the photopatternable layer 4. The cap layer 6 may be formed from a highly light-absorbing or highly light-reflective material including, but not limited to, a DARC, a BARC, and a metal coating. These coatings may be conventional inorganic or organic coatings. For example, the cap layer 6 may include, but is not limited to, amorphous carbon ("α-carbon"), silicon carbide, titanium nitride ("TiN"), silicon nitride ("SiN"), and silicon oxynitride ("SiON"). The cap layer 6 may be deposited by conventional deposition techniques. For instance, inorganic or metallic coatings may be deposited by CVD ("chemical vapor deposition"), vacuum deposition, or sputtering. Organic coatings may be deposited by spin coating.

The cap layer 6 may be formed at a sufficient thickness to prevent radiation from passing into the photopatternable layer 4. However, the thickness of the cap layer 6 may be limited by the ability to etch the cap layer 6 during subsequent processing of the semiconductor device structure. For example, if the cap layer 6 is too thick, it may not be possible to etch the cap layer 6 as desired. For sake of example only, the cap layer 6 may be thicker than approximately 10 nm (100 Angstroms ("Å")). If the cap layer 6 is formed from α-carbon, it may be approximately 1000 to 2000 Å thick. If the cap layer 6 is formed from SiON, the thickness may be less than approximately 400 Å. If the cap layer 6 is formed from a BARC, the thickness may be greater than approximately 300-3000 Å.

A photoresist layer 8 may be formed over the cap layer 6, as illustrated in FIG. 1C. The photoresist layer 8 may be formed from a conventional photoresist material that is capable of providing a high resolution pattern. For instance, the photoresist layer 8 may be formed from a photoresist material sensitive to a short wavelength, such as a wavelength ranging from approximately 100 nm to approximately 500 nm. For instance, the photoresist material may be sensitive to a wavelength of 193 nm or 248 nm.

Conventional photolithography and etch processes may be used to provide the desired pattern in the photoresist layer 8 and cap layer 6. Portions of the photoresist layer 8 may be exposed to a first wavelength 10 of radiation through a mask (not shown). The first wavelength 10 of radiation may be UV radiation, DUV radiation, or X-ray radiation. With the cap layer 6 present, the first wavelength 10 of radiation may not pass into the photopatternable layer 4. Rather, the cap layer 6 may absorb or reflect the first wavelength 10, protecting the photopatternable layer 4 from undesirable exposure. Therefore, an intermediate semiconductor device structure that includes the cap layer 6 may be exposed to any wavelength of radiation as the first wavelength 10. In other words, the intermediate semiconductor device structure may be exposed to any wavelength of radiation, such as the wavelength that is most efficient to pattern the photoresist layer 8, and is not limited to the wavelength that is most efficient to initiate the PAG. In one embodiment, the first wavelength 10 ranges from approximately 100 nm to approximately 300 nm.

The exposed portions of the photoresist layer 8 may be removed using a conventional developer solution, such as an aqueous solution of TMAH, choline, sodium silicate, sodium hydroxide, or potassium hydroxide. It is also contemplated that unexposed portions of the photoresist layer 8 may be removed, instead of the exposed portions, by utilizing a different developer solution that may be selected by one of ordinary skill in the art. The pattern in the photoresist layer 8 may be extended through the cap layer 6 to expose a portion of the photopatternable layer 4, as shown in FIG. 1D. Since the high resolution photoresist is used in the photoresist layer 8, the pattern transferred to the photopatternable layer 4 may also have a high resolution.

With the cap layer 6 and photoresist layer 8 overlying portions of the photopatternable layer 4 (portions that were not exposed to the first wavelength 10 of radiation), the intermediate semiconductor device structure may be exposed to a second wavelength 14 of radiation, as shown in FIG. 1E. The second wavelength 14 may be a sufficient wavelength to activate the PAG in exposed portions of the photopatternable layer 4 and initiate the photochemical reaction. For instance, the second wavelength 14 may be the wavelength or wavelength range that most effectively activates the PAG. The second wavelength 14 of radiation may be UV radiation, DUV radiation, or X-ray radiation. The activated PAG may produce protons (or the acid) that react with the organosilicon photoresist material of the photopatternable layer 4. The photochemical reaction converts the exposed portions of the photopatternable layer 4 into $SiO_2$-based portion 12 by cleaving Si—N bonds in the exposed portions of the photopatternable layer 4 and forming Si—O bonds. Since the PAG is only activated in the exposed portions, the photochemical reaction only occurs in these portions, causing selective conversion of the photopatternable layer 4 to the $SiO_2$-based portion 12.

Since the cap layer 6 overlies portions of the photopatternable layer 4, the intermediate semiconductor device structure may be patterned at any wavelength of radiation, without that radiation impacting the underlying, unexposed, portions of the photopatternable layer 4. However, the exposed portions of the photopatternable layer 4 may subsequently be selectively converted to the $SiO_2$-based portion 12. Therefore, the patterning and the conversion processes may be performed at a wavelength optimal for each process without compromising between achieving a high resolution pattern and efficient conversion of the photopatternable layer 4 to the $SiO_2$-based portion 12.

As shown in FIG. 1F, the photoresist layer 8 and the cap layer 6 may be removed from the intermediate semiconductor device structure by conventional wet or dry etching processes. The photoresist layer 8 and the cap layer 6 may be removed by an etching process that simultaneously removes both layers without etching the photopatternable layer 4. For example, if the cap layer 6 is formed from α-carbon, an oxygen plasma may be used to simultaneously remove the cap layer 6 and the photoresist layer 8. The cap layer 6 and the photoresist layer 8 may also be removed separately by multiple etching processes.

The remaining portions of the photopatternable layer 4 may be converted to $SiO_2$-based portions 12' by exposure to the appropriate wavelength of radiation, as shown in FIG. 1G. If desired, the $SiO_2$-based portions 12' may be subsequently converted to $SiO_2$ by conventional techniques, such as by ashing in oxygen at a temperature greater than approximately 200° C., followed by an anneal in oxygen or by a steam anneal.

It is also contemplated that the cap layer 6 may remain on the semiconductor substrate 2 after the necessary photolithography and etching processes have been performed. For instance, if the material of the photopatternable layer 4 is sufficiently stable, it may not be necessary to convert the photopatternable layer 4 to the $SiO_2$-based material to increase its stability and, therefore, it may not be necessary to remove the remaining portions of the cap layer 6.

Figure 2A:
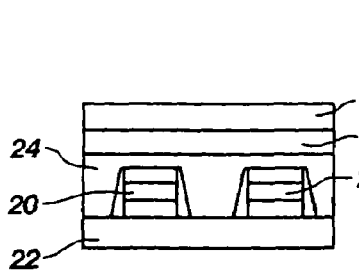
FIGS. 2A-2H show a process sequence of semiconductor device structures in accordance with the present invention resulting in an embodiment having a self-aligned contact.

In one embodiment, a self-aligned contact ("SAC") is formed. The SAC may be formed between transistor gate structures, such as in a DRAM memory cell array. As shown in FIG. 2A, transistor gate structures 20 may be formed on a semiconductor substrate 22. These transistor gate structures 20 are formed by conventional techniques and may include a plurality of layers, such as a polysilicon layer, a tungsten silicide layer, and a plurality of insulative layers. A photopatternable layer 24 may be deposited over the transistor gate structures 20 to fill in spaces between the transistor gate structures 20. Although two transistor gate structures 20 are shown in FIG. 2A, it is understood that any number of transistor gate structures 20 may be present.

Figure 2B:
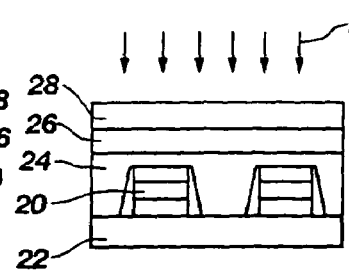
Figure 2C:
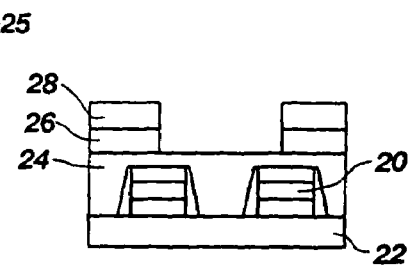
Figure 2D:
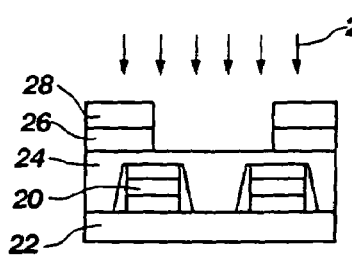
Figure 2E:
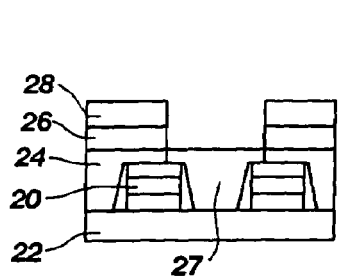
Figure 2F:
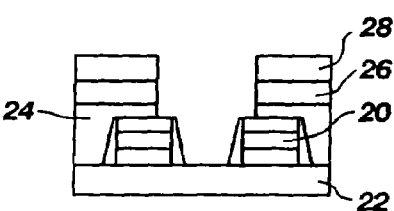
Figure 2G:
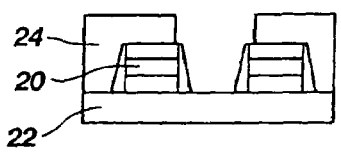
Figure 2H:
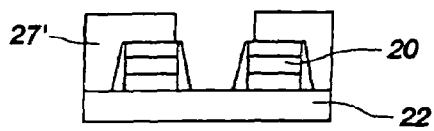

As shown in FIGS. 2B and 2C, a cap layer 26 and photoresist layer 28 may be deposited over the photopatternable layer 24 and patterned as previously described to expose portions of the photopatternable layer 24. The exposed portions of the photopatternable layer 24 may be exposed to a first wavelength 25 of radiation. As shown in FIGS. 2D and 2E, the exposed portions of the photopatternable layer 24 pattern may be exposed to the second wavelength 23 of radiation, which has a wavelength most effective to convert these portions to a $SiO_2$-based material, to produce $SiO_2$-based portion 27. The unexposed portions of the photopatternable layer 24 are protected by the cap layer 26 and, therefore, protons are not produced from the PAG in those portions. As shown in FIG. 2F, the $SiO_2$-based portion 27 may be removed using an etchant selective for the $SiO_2$-based material, leaving a portion of the surface of the semiconductor substrate 22 exposed. The photoresist layer 28 and the cap layer 26 may be removed, as shown in FIGS. 2G and 2H, and remaining portions of the photopatternable layer 24 converted to $SiO_2$-based portions 27' by exposure to radiation.

The SAC may be formed in the etched areas between the transistor gate structures 20. As shown in the art, a contact layer of the SAC may be formed from polysilicon, copper, aluminum, tungsten silicide, or another conductive contact material.

It is also contemplated that the cap layer described herein may be used to form additional semiconductor device structures including, but not limited to, self-aligned vias, dielectric layers, trenches, shallow trench isolation, conductors, insulators, capacitors, gates, and source/drain junctions. These semiconductor device structures may be used in the fabrication of semiconductor memory devices, such as dynamic random access memories ("DRAMs"), static random access memories ("SRAMs"), synchronous DRAMs ("SDRAMS"), FLASH memories, and other memory devices. For instance, in the formation of the self-aligned via, the cap layer may be deposited, as previously described, over a first metal structure. The cap layer may include an antireflective coating, such as a DARC or TiN. A photopatternable layer including a PSZ compound and a PAG may be formed over the first metal structure and the cap layer. The photopatternable layer and the cap layer may be removed at locations from which the self-aligned via is to extend down from a second metal structure. When an intermediate semiconductor device structure is exposed to radiation, a reflection of the radiation from the first metal structure may be used to enhance the activation of the PAG. This may be achieved by controlling an amount, or dose, of radiation reflected from the first metal structure. Only when the dose of radiation is sufficient may the PAG be sufficiently activated to convert the photopatternable layer to the $SiO_2$-based material. The $SiO_2$-based material may subsequently be removed to create the self-aligned via. Since formation of the self-aligned via depends on the reflection of radiation from the first metal structure, the resulting via is self-aligned.

As described herein, the cap layer may be used to isolate the patterning process and the conversion process so that conditions of each of these processes may be optimized without impacting the other process. In other words, the wavelength most optimal to performing the patterning process may be used to pattern the intermediate semiconductor device structure while the wavelength most optimal to converting the organosilicon photoresist material to the $SiO_2$-based material may also be used. The cap layer prevents the radiation from penetrating into the photopatternable layer and, therefore, allows the intermediate semiconductor device structure to be exposed to wavelengths of radiation that were previously unusable.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope thereof as defined by the following appended claims.

What is claimed is:

1. A method of forming an intermediate semiconductor device structure, comprising:
   forming a cap layer over a photopatternable material including a photoacid generator on a semiconductor substrate;
   forming a photoresist over the cap layer;
   revealing at least a portion of the photopatternable material;
   exposing the at least a portion of the photopatternable material to a first wavelength of radiation to selectively convert the at least a portion of the photopatternable material to a silicon dioxide-based material;
   removing the silicon dioxide-based material; and
   converting remaining portions of the photopatternable material to a silicon dioxide-based material.

2. The method of claim 1, further comprising forming a photopatternable material over the semiconductor substrate from a material that is formulated to be selectively converted to a silicon dioxide-based material by exposure to radiation.

3. The method of claim 1, further comprising forming a photopatternable material over the semiconductor substrate from a material that is formulated to be selectively converted to a silsesquioxane material by exposure to radiation.

4. The method of claim 1, wherein the photopatternable material over the semiconductor substrate is selected from the group consisting of silicone polymer, polysilyne and polysilazane.

5. The method of claim 1, wherein the photopatternable material over the semiconductor substrate is an organosilicon photoresist.

6. The method of claim 1, wherein forming the cap layer over the photopatternable material comprises forming a layer of material that prevents radiation from passing into the photopatternable material.

7. The method of claim 1, wherein forming the cap layer over the photopatternable material comprises forming a layer comprising a highly light-absorbing or a highly light-reflective material over the photopatternable material.

8. The method of claim 1, wherein forming the cap layer over the photopatternable material comprises forming a dielectric antireflective coating, a bottom antireflective coating, or a metal coating over the photopatternable material.

9. A method of forming an intermediate semiconductor device structure, comprising:

forming a cap layer comprising a dielectric antireflective coating, a bottom antireflective coating, or a metal coating over a photopatternable material on a semiconductor substrate;

wherein forming the cap layer over the photopatternable material comprises forming the cap layer from a material selected from the group consisting of amorphous carbon, silicon carbide, titanium nitride, silicon nitride, and silicon oxynitride;

forming a photoresist over the cap layer;

revealing at least a portion of the photopatternable material; and exposing the at least a portion of the photopatternable material to a first wavelength of radiation to selectively convert the at least a portion of the photopatternable material to a silicon dioxide-based material.

10. The method of claim 1, wherein forming the cap layer over the photopatternable material comprises forming the cap layer to be of sufficient thickness to prevent radiation from passing into the photopatternable material.

11. The method of claim 1, wherein forming the photoresist over the cap layer comprises forming the photoresist from a photoresist material sensitive to a wavelength from approximately 100 nm to approximately 500 nm.

12. The method of claim 1, wherein forming the photoresist over the cap layer comprises forming the photoresist from a photoresist material sensitive to a wavelength of approximately 193 nm or approximately 248 nm.

13. The method of claim 1, further comprising exposing the photoresist and the cap layer to a second wavelength of radiation to provide a high resolution pattern.

14. The method of claim 13, wherein exposing the photoresist and the cap layer to the second wavelength of radiation to provide a high resolution pattern comprises exposing at least a portion of the photoresist and the cap layer to the second wavelength of radiation without exposing the photopatternable material to the second wavelength of radiation.

15. The method of claim 13, wherein exposing the photoresist and the cap layer to the second wavelength of radiation to provide a high resolution pattern comprises exposing the photoresist and the cap layer to a wavelength ranging from approximately 100 nm to approximately 300 nm.

16. The method of claim 13, wherein exposing the photoresist and the cap layer to the second wavelength of radiation to provide a high resolution pattern comprises exposing the photoresist and the cap layer to a wavelength of 193 nm or a wavelength of 248 nm.

17. The method of claim 1, wherein exposing the at least a portion of the photopatternable material to the first wavelength of radiation comprises selectively converting the at least a portion of the photopatternable material to a silsesquioxane material.

18. The method of claim 17, wherein exposing the at least a portion of the photopatternable material to the first wavelength of radiation comprises selectively converting the at least a portion of the photopatternable material to a silsesquioxane material selected from the group consisting of hydrogen silsesquioxane, methyl silsesquioxane, and phenyl polysilsesquioxane.

19. The method of claim 17, wherein removing the silicon dioxide-based material further comprises removing at least a portion of the silsesquioxane material.

20. The method of claim 19, wherein converting remaining portions of the photopatternable material to a silicon dioxide-based material further comprises converting remaining portions of the photopatternable material to a silsesquioxane material.

21. The method of claim 1, wherein revealing at least a portion of the photopatternable material comprises removing at least a portion of the photoresist and the cap layer.

* * * * *